United States Patent
Ahn et al.

(10) Patent No.: US 8,563,914 B2
(45) Date of Patent: Oct. 22, 2013

(54) UNIT PIXELS INCLUDING BOOSTING CAPACITORS, PIXEL ARRAYS INCLUDING THE UNIT PIXELS AND PHOTODETECTING DEVICES INCLUDING THE PIXEL ARRAYS

(75) Inventors: Jung-chak Ahn, Yongin-si (KR); Kyung-ho Lee, Suwon-si (KR); Shay Hamami, Seongnam-si (KR); Young-hwan Park, Namyangju-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 376 days.

(21) Appl. No.: 12/801,196

(22) Filed: May 27, 2010

(65) Prior Publication Data

US 2011/0036969 A1    Feb. 17, 2011

(30) Foreign Application Priority Data

Aug. 17, 2009  (KR) .................. 10-2009-0075732

(51) Int. Cl.
*H01L 27/146*    (2006.01)
(52) U.S. Cl.
USPC ............... 250/208.1; 250/214 R; 257/292; 257/E27.133; 348/308

(58) Field of Classification Search
USPC ........ 250/208.1, 214.1, 214 R; 257/290, 291, 257/292, 443, E27.133; 348/294, 302, 308
See application file for complete search history.

(56) References Cited

U.S. PATENT DOCUMENTS

2006/0261431 A1* 11/2006 Kim et al. ............ 257/462
2009/0272879 A1* 11/2009 Dai .................... 250/208.1

FOREIGN PATENT DOCUMENTS

| JP | 2008-177357 | 7/2008 |
| KR | 1020060030513 | 4/2006 |
| KR | 100591075 | 6/2006 |
| KR | 1020070025288 | 3/2007 |

* cited by examiner

*Primary Examiner* — Kevin Pyo
(74) *Attorney, Agent, or Firm* — Harness, Dickey & Pierce, P.L.C.

(57) ABSTRACT

A unit pixel capable of achieving full initialization of a floating diffusion area, a pixel array including the unit pixel, and a photodetecting device including the pixel array. The unit pixel includes a photodetector, a transmission transistor for transmitting charges generated from the photodetector to a floating diffusion area, a reset transistor for initializing the floating diffusion area, and a boosting capacitor having a first terminal connected to the floating diffusion area and a second terminal to which a boosting voltage is applied.

3 Claims, 4 Drawing Sheets

US 8,563,914 B2

UNIT PIXELS INCLUDING BOOSTING CAPACITORS, PIXEL ARRAYS INCLUDING THE UNIT PIXELS AND PHOTODETECTING DEVICES INCLUDING THE PIXEL ARRAYS

CROSS-REFERENCE TO RELATED APPLICATIONS

This nonprovisional U.S. application claims priority under 35 U.S.C. §119 to Korean Patent Application No. 10-2009-0075732, filed on Aug. 17, 2009, in the Korean Intellectual Property Office, the entire contents of which are incorporated herein by reference.

BACKGROUND

Inventive concepts relate to a pixel of a photodetecting device, and more particularly, to a unit pixel capable of achieving full initialization of a floating diffusion area.

A photodetecting device converts an image signal input through a lens into an electrical signal, and currently, popular photodetecting devices include a complementary metal-oxide semiconductor (CMOS) image sensor (CIS). A photodetecting device includes two-dimensionally arranged unit pixels as a pixel array for converting an image signal into an electrical signal. Each of the unit pixels includes a photoelectric conversion device for detecting an image signal, e.g., a photodiode, and a driving unit for amplifying and transmitting an output of the photoelectric conversion device.

The driving unit includes a transmission transistor for transmitting charges corresponding to an image signal detected by the photoelectric conversion device to a floating diffusion area, and a conversion transistor for converting the charges stored in the floating diffusion area into an electrical signal corresponding to the charges. Here, the conversion transistor is also referred to as a source follower transistor.

A photodetecting device detects an image signal and converts the image signal into an electrical signal corresponding to the image signal, and then the converted electrical signal may not directly be stored as image data but may be processed as described below before being stored.

In order to detect an image signal and to convert the image signal into an electrical signal, first, a floating diffusion area is initialized by using a voltage and then a first voltage $V_1$ corresponding to the initialized floating diffusion area may be recognized. After that, charges detected by a photodiode are transmitted to the floating diffusion area and a second voltage $V_2$ corresponding to the charges transmitted to the floating diffusion area may be recognized. Image data corresponding to the image signal detected by the photodiode corresponds to the difference between the first and second voltages $V_1$ and $V_2$ ($V_1$-$V_2$).

In order to initialize the floating diffusion area, each of the unit pixels further includes a reset transistor. The reset transistor transmits an initialization voltage applied to a first terminal of the reset transistor to the floating diffusion area through a second terminal of the reset transistor in response to a reset control signal applied to a gate of the reset transistor. Here, the initialization voltage refers to voltage power for initializing the floating diffusion area.

In general, an initialization voltage source connected to a first terminal of a reset transistor may also be connected to a first terminal of a conversion transistor. Thus, in some cases, sufficient charges may not be provided to a floating diffusion area. That is, in some cases, a floating diffusion area may not be completely initialized by using only a reset transistor. Accordingly, a loss occurs while converting an image signal applied from an external unit to an electrical signal. If an electrical signal having a loss is reproduced as an image signal, an image signal different from an original image signal may be displayed.

SUMMARY

Inventive concepts provide a pixel capable of achieving full initialization of a floating diffusion area.

Inventive concepts also provide an image sensor array capable of achieving full initialization of a floating diffusion area.

Inventive concepts also provide an image sensor capable of achieving full initialization of a floating diffusion area.

According to an aspect of inventive concepts, there is provided a unit pixel including a photodetector, a transmission transistor for transmitting charges generated from the photodetector to a floating diffusion area, a reset transistor for initializing the floating diffusion area, and a boosting capacitor having a first terminal connected to the floating diffusion area and a second terminal to which a boosting voltage is applied.

According to another aspect of inventive concepts, there is provided a unit pixel including a floating diffusion area for accumulating charges generated from a photodetector or charges corresponding to an initialization voltage transmitted from a reset transistor, a conductor for covering the whole or a portion of the floating diffusion area, and an insulator having a thickness and disposed between the floating diffusion area and the conductor.

According to another aspect of inventive concepts, there is provided a pixel array including two-dimensionally arranged unit pixels, wherein each unit pixel includes a photodetector, a transmission transistor for transmitting charges generated from the photodetector to a floating diffusion area, a reset transistor for initializing the floating diffusion area, and a boosting capacitor having a first terminal connected to the floating diffusion area and a second terminal to which a boosting voltage is applied, and wherein one line for providing the boosting voltage is commonly connected to the second terminals of the boosting capacitors of a plurality of unit pixels arranged in one horizontal line or one vertical line.

According to another aspect of inventive concepts, there is provided a pixel array including two-dimensionally arranged unit pixels, wherein each unit pixel includes a floating diffusion area for accumulating charges generated from a photodetector or charges corresponding to an initialization voltage transmitted from a reset transistor, a conductor for covering the whole or a portion of the floating diffusion area, and an insulator having a thickness and disposed between the floating diffusion area and the conductor. The conductor is commonly connected to a plurality of unit pixels arranged in one horizontal line or one vertical line.

According to another aspect of inventive concepts, there is provided a photodetecting device including a pixel array including two-dimensionally arranged unit pixels, and a decoder for controlling the pixel array. Each unit pixel includes a photodetector, a transmission transistor for transmitting charges generated from the photodetector to a floating diffusion area, a reset transistor for initializing the floating diffusion area, and a boosting capacitor having a first terminal connected to the floating diffusion area and a second terminal to which a boosting voltage is applied, and wherein one line for providing the boosting voltage is commonly connected to the second terminals of the boosting capacitors of a plurality of unit pixels arranged in one horizontal line or one vertical line.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
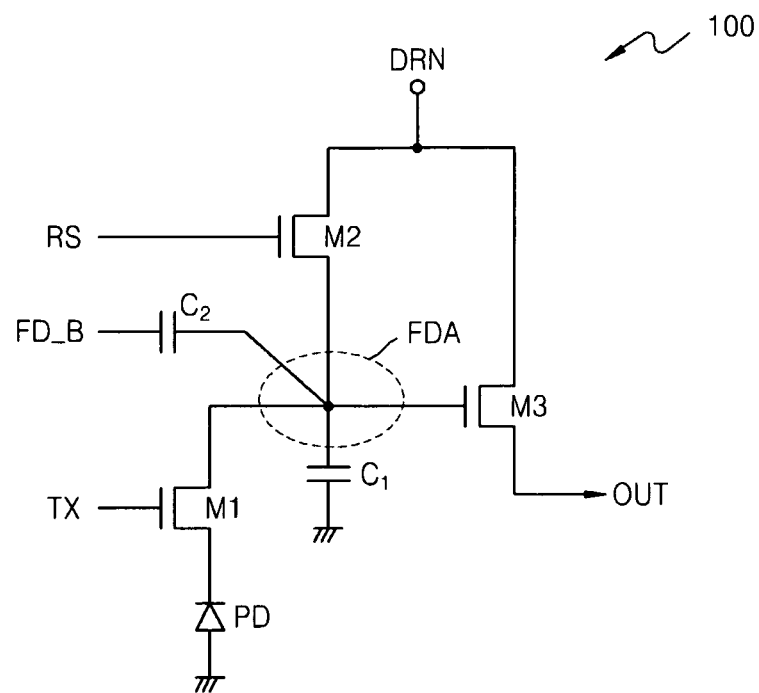
FIG. 1 is a circuit diagram of a unit pixel, according to an example embodiment of inventive concepts.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the sizes and relative sizes of elements may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram of a unit pixel 100, according to an example embodiment of inventive concepts.

Referring to FIG. 1, the unit pixel 100 includes a photodetector PD, a transmission transistor M1, a reset transistor M2, a conversion transistor M3 and a boosting capacitor $C_2$.

The photodetector PD may be a photodiode. In the following descriptions, unless otherwise mentioned, a photodetector and a photodiode denote the same element.

In response to a transmission signal TX applied to a gate of the transmission transistor M1, the transmission transistor M1 transmits image charges generated from the photodetector PD connected to a first terminal of the transmission transistor M1 to a floating diffusion area FDA (a dotted-line circle) connected to a second terminal of the transmission transistor M1. In response to a reset signal RS applied to a gate of the reset transistor M2, the reset transistor M2 transmits a drain voltage DRN applied to a first terminal of the reset transistor M2 to the floating diffusion area FDA, which is connected to a second terminal of the reset transistor M2. A first terminal of the conversion transistor M3 is connected to the drain voltage DRN, and the conversion transistor M3 generates an electrical signal corresponding to charges accumulated in the floating diffusion area FDA, which is connected to a gate of the conversion transistor M3, and outputs the electrical signal to a second terminal of the conversion transistor M3. Here, with respect to the reset transistor M2, the drain voltage DRN is an initialization voltage.

The floating diffusion area FDA is commonly connected to the second terminals of the transmission transistor M1 and the reset transistor M2. Since charges corresponding to an image signal and charges corresponding to an initialization voltage are commonly accumulated in the floating diffusion area FDA, the floating diffusion area FDA may be substituted by a model capacitor $C_1$.

In order to achieve more complete initialization of the floating diffusion area FDA, the boosting capacitor $C_2$ is used. A first terminal of the boosting capacitor $C_2$ is connected to the floating diffusion area FDA and a boosting voltage FD_B is applied to a second terminal of the boosting capacitor $C_2$. The boosting capacitor $C_2$ may be formed according to a general semiconductor process for forming a pixel, without having to perform any particular additional process. In other words, since an insulator is generally deposited on the floating diffusion area FDA, the boosting capacitor $C_2$ may be formed by merely forming a metal functioning as one electrode of the boosting capacitor $C_2$, vertically above the floating diffusion area FDA and the insulator. Here, in order to accurately control the capacitance of the boosting capacitor $C_2$, the material and thickness of an insulator to be deposited or to be thermally grown on an area for forming the boosting capacitor $C_2$ may be controlled.

The charges corresponding to the drain voltage DRN input through the reset transistor M2, i.e., the initialization voltage, are accumulated in the floating diffusion area FDA. However, occasionally, the drain voltage DRN may not supply a sufficient current or may not be provided to the floating diffusion area FDA for a sufficient amount of time. As such, in some cases, the floating diffusion area FDA may not be sufficiently initialized. In order to cope with such cases, after the reset transistor M2 is turned on to initialize the floating diffusion area FDA and before the transmission transistor M1 is turned on to transmit the charges corresponding to the image signal to the floating diffusion area FDA, the floating diffusion area FDA is reinitialized by using the boosting capacitor $C_2$.

Figure 2:
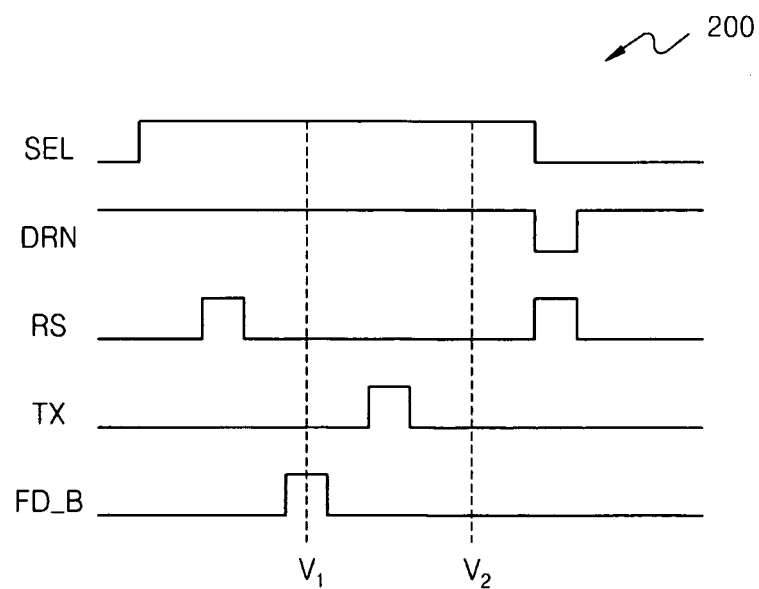
FIG. 2 illustrates waveforms of signals used in the unit pixel illustrated in FIG. 1, according to an example embodiment of inventive concepts.

FIG. 2 illustrates waveforms 200 of signals used in the unit pixel 100 illustrated in FIG. 1, according to an example embodiment of inventive concepts. FIG. 2 will be described in conjunction with FIG. 1.

Referring to FIG. 2, first and second voltages $V_1$ and $V_2$ are detected in a time period during when a cell selection signal SEL is enabled into a high state. While the cell selection signal SEL is enabled, the drain voltage DRN is maintained in a high state, the reset transistor M2 is turned on according to the reset signal RS, and then the transmission transistor M1 is turned on according to the transmission signal TX. The first voltage $V_1$ is detected after the reset signal RS is enabled and before the transmission signal TX is enabled, and the second voltage $V_2$ is detected after the transmission signal TX is enabled and before the cell selection signal SEL is disabled.

The boosting voltage FD_B is applied to the first terminal of the boosting capacitor $C_2$ and is enabled after the reset signal RS is enabled and before the transmission signal TX is enabled. In some cases, the boosting voltage FD_B may be enabled when the first voltage $V_1$ is detected.

Figure 3:
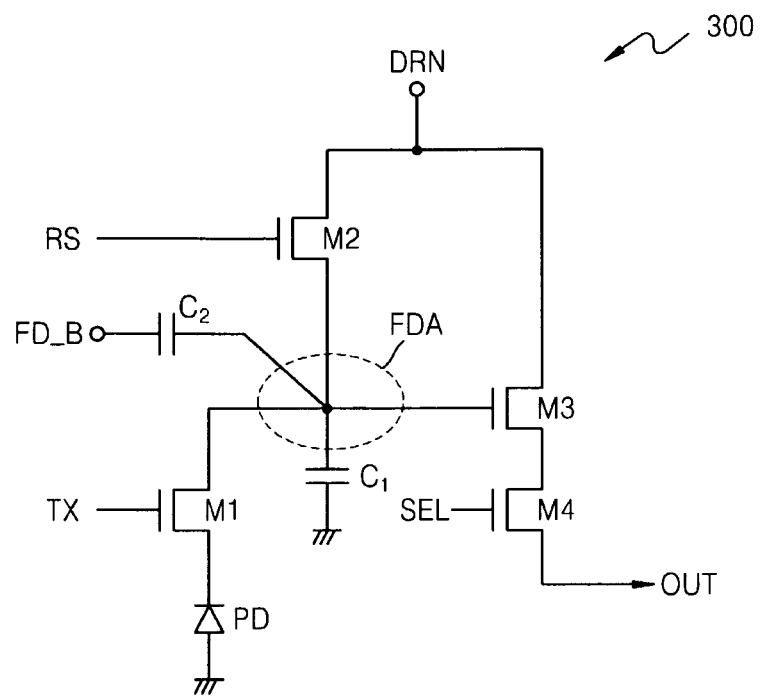
FIG. 3 is a circuit diagram of a unit pixel, according to another example embodiment of inventive concepts.

FIG. 3 is a circuit diagram of a unit pixel 300, according to another example embodiment of inventive concepts.

Referring to FIG. 3, the unit pixel 300 is identical to the unit pixel 100 illustrated in FIG. 1 except that a selection transistor M4 that operates in response to a cell selection signal SEL is further included. In particular, with respect to the floating diffusion area FDA, the unit pixels 100 and 300 are identical to each other.

Figure 4:
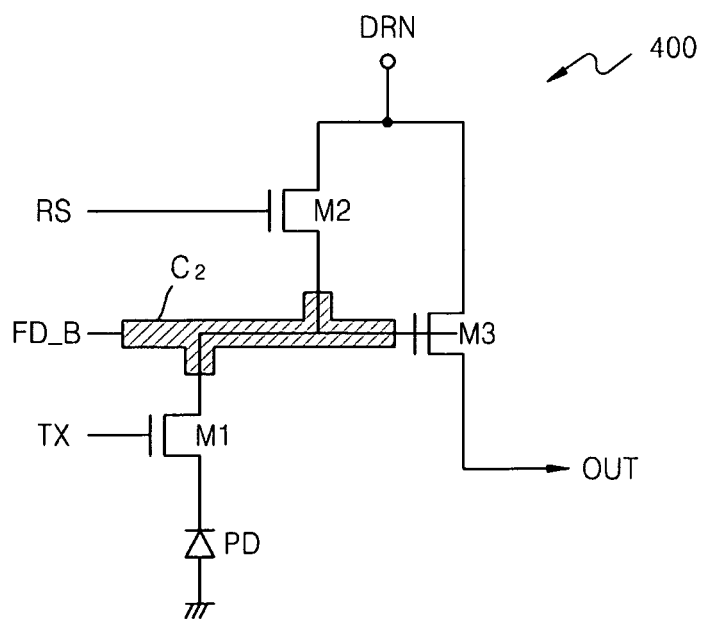
FIG. 4 is a diagram showing the physical shape of a boosting capacitor of a unit pixel, according to an example embodiment of inventive concepts.

FIG. 4 is a diagram showing the physical shape of a boosting capacitor of a unit pixel 400, according to an example embodiment of inventive concepts.

Referring to FIG. 4, the boosting capacitor $C_2$ covers the whole or a portion of a floating diffusion area and is indicated as a shaded region. The shaded portion may define the floating diffusion area and may also define a conductor, that is, one electrode of the boosting capacitor. Here, the conductor may be formed of a metal or a polysilicon.

Meanwhile, although not clearly illustrated in FIG. 4, an insulator is disposed between two electrodes of the boosting capacitor. Here, a first electrode of the boosting capacitor $C_2$ may correspond to the floating diffusion area, a second electrode of the boosting capacitor $C_2$ may correspond to the conductor, and the insulator may be formed of various insulators used in semiconductor manufacturing processes, for example, $SiO_2$, $Si_3N_4$, or $SiON$. The first electrode of the boosting capacitor $C_2$ may be referred to as a floating diffusion unit.

Figure 5:
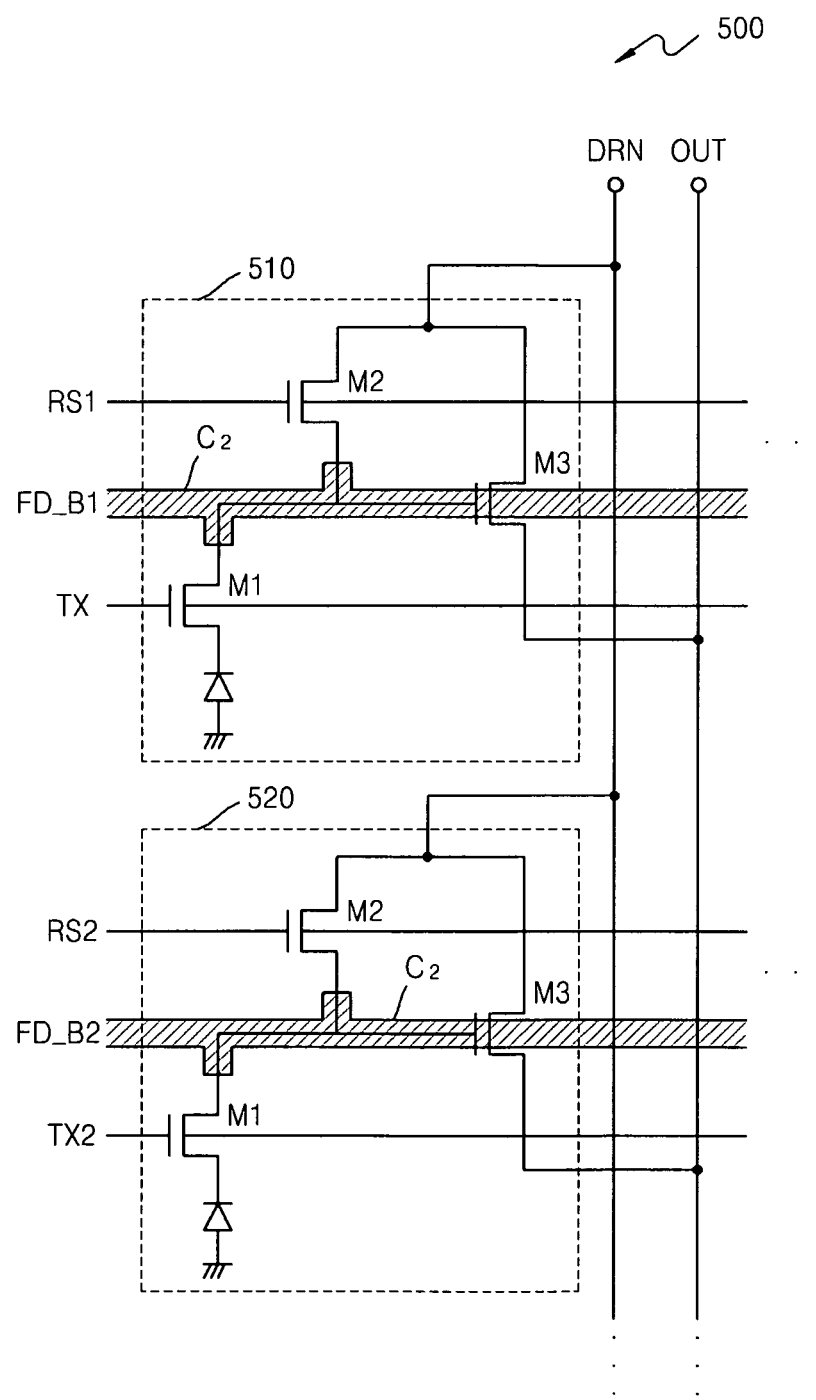
FIG. 5 is a circuit diagram of a pixel array including a plurality of unit pixels identical to the unit pixel illustrated in FIG. 1, according to an example embodiment of inventive concepts.

FIG. 5 is a circuit diagram of a pixel array 500 including a plurality of unit pixels identical to the unit pixel 100 illustrated in FIG. 1, according to an example embodiment of inventive concepts.

Referring to FIG. 5, the unit pixels, including pixels 510 and 520, are arranged in horizontal and vertical directions in the pixel array 500 and are the same as the unit pixel 100. The structure illustrated in FIG. 5 is commonly used and thus only peculiar features of the pixel array 500 will be described here without providing general descriptions thereof.

A boosting capacitor $C_2$ is formed on a floating diffusion area by using a metal or polysilicon line that extends in the horizontal direction. Since a drain voltage line DRN and an output line OUT extend in the vertical direction and boosting voltage lines FD_B1 and FD_B2 are designed to extend in the horizontal direction instead of the vertical direction, the floating diffusion area may be completely initialized without damaging a photodiode area.

If the boosting voltage lines FD_B1 and FD_B2 are designed to extend in the same direction as the drain voltage line DRN and the output line OUT, then the metal or polysilicon line may be formed on the photodiode and thus a detect area for receiving an image signal may be reduced. Therefore, if the drain voltage line DRN and the output line OUT extend in the horizontal direction, the boosting voltage lines FD_B1 and FD_B2 may be designed to extend in the vertical direction.

Figure 6:
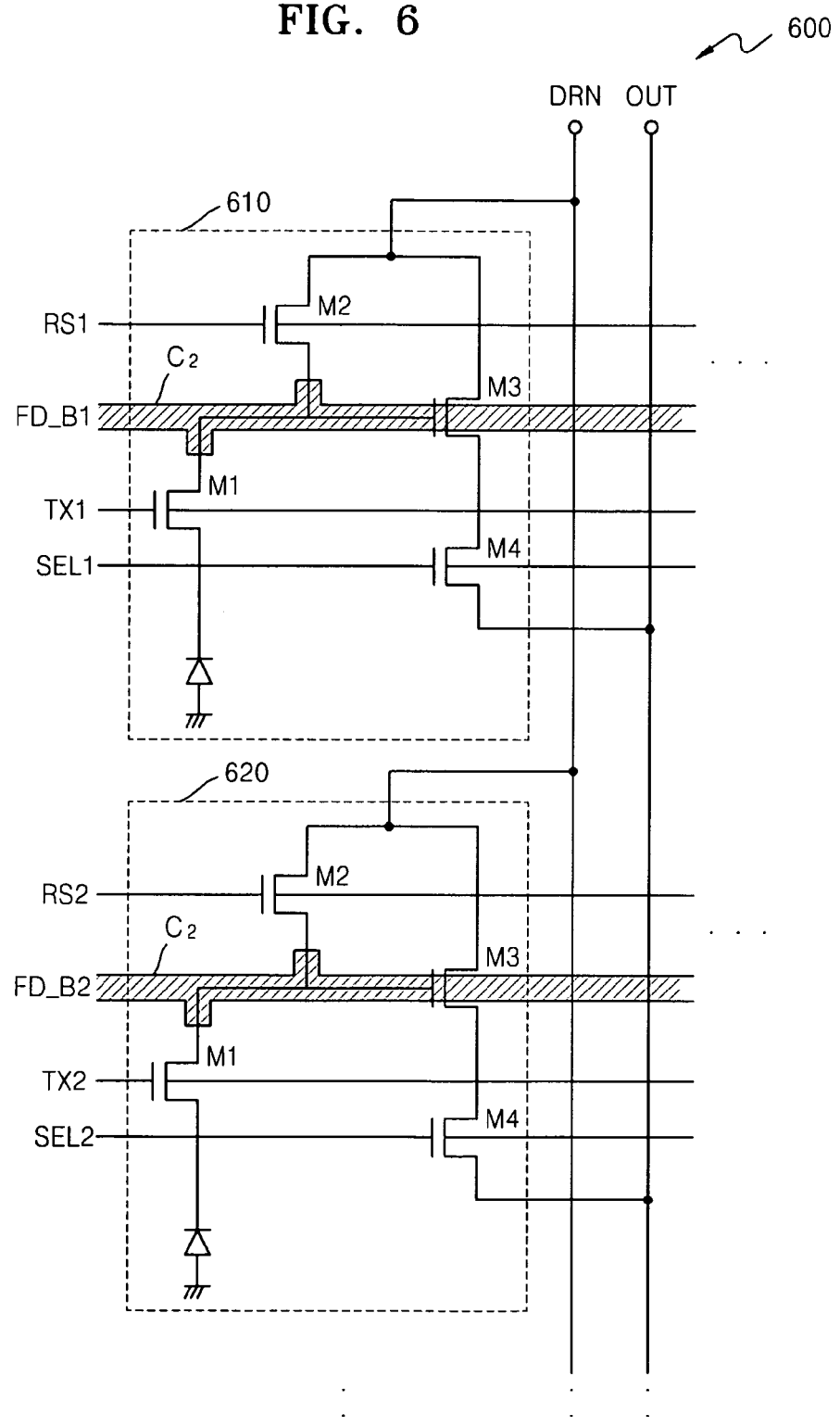
FIG. 6 is a circuit diagram of a pixel array including a plurality of unit pixels identical to the unit pixel illustrated in FIG. 3, according to an example embodiment of inventive concepts.

FIG. 6 is a circuit diagram of a pixel array 600 including a plurality of unit pixels identical to the unit pixel 300 illustrated in FIG. 3, according to an example embodiment of inventive concepts.

Referring to FIG. 6, the pixel array 600 is identical to the pixel array 500 illustrated in FIG. 5 except that a selection transistor M4 is further included in each unit pixel 610 and 620.

In general, a photodetecting device includes a pixel array including unit pixels and a decoder for driving the pixel array. Although not shown in FIGS. 1 through 6, it will be understood by those of ordinary skill in the art that forming of a photodetecting device is also included in the scope of inventive concepts.

While inventive concepts have been particularly shown and described with reference to example embodiments thereof, it will be understood that various changes in form and details may be made therein without departing from the spirit and scope of the following claims.

What is claimed is:

1. A unit pixel comprising:
   a photodetector configured to generate charges;
   a transmission transistor configured to transmit the charges generated from the photodetector to a floating diffusion area based on a transmission signal;
   a reset transistor configured to apply an initialization voltage to the floating diffusion area; and
   a boosting capacitor having a first terminal connected to the floating diffusion area and a second terminal configured to receive a boosting voltage, the transmission signal and boosting voltage being independent from one another, wherein the boosting capacitor is configured to receive the boosting voltage only when the reset transistor is turned off and the transmission transistor is turned off.

2. A pixel array comprising:
   two-dimensionally arranged unit pixels, wherein each unit pixel includes,
   a photodetector configured to generate charges,
   a transmission transistor configured to transmit the charges generated from the photodetector to a floating diffusion area based on a transmission signal,
   a reset transistor configured to apply an initialization voltage to the floating diffusion area, and
   a boosting capacitor having a first terminal connected to the floating diffusion area and a second terminal configured to receive a boosting voltage, the boosting voltage being transmitted through a line that is commonly connected to the second terminals of the boosting capacitors of a plurality of unit pixels arranged in one horizontal line or one vertical line, the transmission signal and boosting voltage being independent from one another, wherein the boosting capacitor is configured to receive the boosting voltage only when the reset transistor is turned off and the transmission transistor is turned off.

3. A photodetecting device comprising:

a pixel array comprising two-dimensionally arranged unit pixels; and a decoder for controlling the pixel array,
- wherein each unit pixel includes,
    - a photodetector configured to generate charges,
    - a transmission transistor configured to transmit the charges generated from the photodetector to a floating diffusion area based on a transmission signal,
    - a reset transistor configured to apply an initialization voltage to the floating diffusion area, and
    - a boosting capacitor having a first terminal connected to the floating diffusion area and a second terminal configured to receive a boosting voltage, the boosting voltage being transmitted through a line that is commonly connected to the second terminals of the boosting capacitors of a plurality of unit pixels arranged in one horizontal line or one vertical line, the transmission signal and boosting voltage being independent from one another, wherein the boosting capacitor is configured to receive the boosting voltage only when the reset transistor is turned off and the transmission transistor is turned off.

\* \* \* \* \*